US007583408B2

(12) United States Patent
Maeda et al.

(10) Patent No.: US 7,583,408 B2
(45) Date of Patent: Sep. 1, 2009

(54) IMAGE-FORMING APPARATUS AND CONTROL METHOD THEREOF

(75) Inventors: Yoritsugu Maeda, Toride (JP); Akira Morisawa, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 524 days.

(21) Appl. No.: 11/466,567

(22) Filed: Aug. 23, 2006

(65) Prior Publication Data

US 2007/0046962 A1 Mar. 1, 2007

(30) Foreign Application Priority Data

Aug. 31, 2005 (JP) ............................ 2005-252467
Jul. 24, 2006 (JP) ............................ 2006-200873

(51) Int. Cl.

*G06F 15/00* (2006.01)
*H04N 1/46* (2006.01)
*G03F 3/08* (2006.01)
*G06K 9/00* (2006.01)
*G03G 15/00* (2006.01)

(52) U.S. Cl. ........................ 358/1.9; 358/504; 358/515; 358/518; 358/3.18; 358/3.26; 382/112; 382/162; 382/167; 399/49; 399/50; 399/51

(58) Field of Classification Search ................. 358/504, 358/3.18, 1.9, 3.26, 1.18, 518, 523, 515; 382/162, 167, 112; 399/46, 299, 49, 50, 399/51

See application file for complete search history.

(56) References Cited

U.S. PATENT DOCUMENTS 5,697,030 A * 12/1997 Hayashi et al. ............. 399/299
6,501,917 B1 * 12/2002 Karasawa .................... 399/46

FOREIGN PATENT DOCUMENTS

| | | |
|---|---|---|
| JP | 01-229276 | 9/1989 |
| JP | 02-220082 | 9/1990 |
| JP | 06-067535 | 3/1994 |
| JP | 10-039608 | 2/1998 |
| JP | 2004-243560 | 9/2004 |
| JP | 06-11965 | 8/2006 |

* cited by examiner

*Primary Examiner*—Edward L Coles
*Assistant Examiner*—Charlotte M Baker
(74) *Attorney, Agent, or Firm*—Canon USA Inc. IP Div

(57) ABSTRACT

An image density in a predetermined section of an image represented by an image signal is calculated on the basis of the image signal, and the calculated image density is compared with the result of detection of a density in the predetermined section of a toner image formed on the basis of the image signal. Then, it is determined whether or not to perform a density-adjusting process in which an image-density adjustment is performed on the basis of correction pattern data. Thus, the density adjustment is performed at a suitable timing while monitoring the density of images formed in a normal image-forming operation.

10 Claims, 8 Drawing Sheets

S

IMAGE

VIDEO COUNT

| | | | | | | | |
|---|---|---|---|---|---|---|---|
| 0 | 100 | 0 | 100 | 0 | 100 | 0 | 0 |
| 100 | 0 | 0 | 0 | 100 | 100 | 100 | 0 |
| 0 | 0 | 0 | 100 | 0 | 100 | 100 | 0 |
| 0 | 0 | 0 | 100 | 0 | 0 | 100 | 0 |
| 0 | 100 | 0 | 0 | 0 | 100 | 0 | 100 |

S

IMAGE

VIDEO COUNT

| | | | | | | | |
|---|---|---|---|---|---|---|---|
| 20 | 60 | 40 | 60 | 20 | 20 | 60 | 20 |
| 40 | 20 | 40 | 20 | 40 | 20 | 40 | 20 |
| 0 | 40 | 60 | 0 | 60 | 40 | 60 | 20 |
| 40 | 60 | 60 | 40 | 60 | 60 | 20 | 20 |
| 60 | 40 | 20 | 20 | 40 | 20 | 40 | 60 |

S

IMAGE

VIDEO COUNT

| | | | | | | | |
|---|---|---|---|---|---|---|---|
| 0 | 20 | 0 | 0 | 20 | 0 | 0 | 0 |
| 0 | 0 | 0 | 40 | 0 | 40 | 0 | 0 |
| 20 | 40 | 0 | 0 | 0 | 20 | 0 | 40 |
| 0 | 0 | 0 | 20 | 0 | 0 | 0 | 0 |
| 0 | 20 | 0 | 40 | 0 | 40 | 0 | 0 |

IMAGE-FORMING APPARATUS AND CONTROL METHOD THEREOF

BACKGROUND OF THE INVENTION

1. Field of the Invention

The present invention relates to an image-forming apparatus that forms an image by transferring a toner image formed on an image carrier onto a recording medium and a control method for controlling the image-forming apparatus.

2. Description of the Related Art

In printers, copy machines, etc., using electrophotographic technology, input image data is converted into electrical signals and a laser is driven on the basis of the obtained electrical signals, so that an electrostatic latent image corresponding to the image data is formed on a photosensitive member. The thus formed electrostatic latent image is visualized as a toner image by a developing device and is then transferred onto a recording sheet.

In monochrome printers in which images are formed using black developer (toner), the density of the images greatly affects the printing quality. Similarly, in color printers in which color images are formed using yellow (Y), magenta (M), cyan (C), and black (K) toners, the density of the images formed by the toner of each color greatly affects the printing quality. Accordingly, Japanese Patent Laid-Open No. 6-11965 discusses a structure in which a correction pattern used for density correction is formed on a recording sheet every time a predetermined number of recording sheets are subjected to printing. The thus formed correction pattern is optically read and the density of image data is corrected on the basis of a signal obtained by optically reading the correction pattern, thereby maintaining high image quality.

According to Japanese Patent Laid-Open No. 6-11965, even when continuous printing is performed, the density correction sequence is executed every time the predetermined number of recording sheets are subjected to printing in order to maintain the printing quality. However, since the timing at which the density correction sequence is performed depends on the number of recording sheets that are subjected to printing, this timing does not always match the timing at which the density correction is required in practice. More specifically, even if the density correction is necessary, the density correction sequence is not executed until the predetermined number of recording sheets are subjected to printing. Therefore, there is a risk that the quality of the printed image is reduced during the printing operation. In addition, if the predetermined number of recording sheets are subjected to printing even though the density correction is not required, the density correction sequence is unnecessarily executed. In such a case, the toner and the recording sheet are wasted and the operating cost is increased as a result. In addition, since printing cannot be performed while the density correction sequence is being executed, the productivity is largely reduced when the density correction sequence is performed unnecessarily.

SUMMARY OF THE INVENTION

To at least mitigate the above-described problems, some features of the present invention provide an image-forming apparatus that performs density adjustment at a suitable timing by observing the density of images formed in a normal image-forming operation and a control method for controlling the image-forming apparatus.

According to a first aspect of the present invention, an image-forming apparatus that forms an image by transferring a toner image formed on an image carrier onto a recording medium includes a density detector that detects a density of a toner image on the image carrier; a density adjuster that forms a correction pattern and performs an image-density adjustment on the basis of the correction pattern and the density of the toner image that is detected the density detector; an image-density calculator that calculates an image density in a predetermined section of an image represented by an image signal which is different from the correction pattern, the image density being calculated on the basis of the image signal; a comparator that compares the image density calculated by the image-density calculator and the result of detection performed by the density detector to obtain a density in the predetermined section of a toner image formed on the basis of the image signal; and a determiner that determines whether or not to cause the density adjuster to perform the image-density adjustment on the basis of the result of comparison performed by the comparator.

According to a second aspect of the present invention, a method for controlling an image-forming apparatus that forms an image by transferring a toner image formed on an image carrier onto a recording medium includes a density-detecting step of detecting the density of a toner image on the image carrier; a density-adjusting step of performing an image-density adjustment on the basis of the correction pattern and the density of the toner image that is detected in the density-detecting step; an image-density-calculating step of calculating an image density in a predetermined section of an image represented by an image signal which is different from the correction pattern, the image density being calculated on the basis of the image signal; a comparing step of comparing the image density calculated in the image-density-calculating step and the result of detection performed in the density-detecting step to obtain a density in the predetermined section of a toner image formed on the basis of the image signal; and a determining step of determining whether or not to perform the density-adjusting step of adjusting the image density on the basis of the result of comparison performed in the comparing step.

Other features and advantages of the present invention will be apparent from the following description when taken in conjunction with the accompanying drawings, in which like reference characters designate the same or similar parts throughout.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

An embodiment of the present invention will be described below with reference to the accompanying drawings. The present invention is not limited by the embodiment described below, and not all of the combinations of features described in the following embodiment are essential for carrying out the invention.

Figure 1:
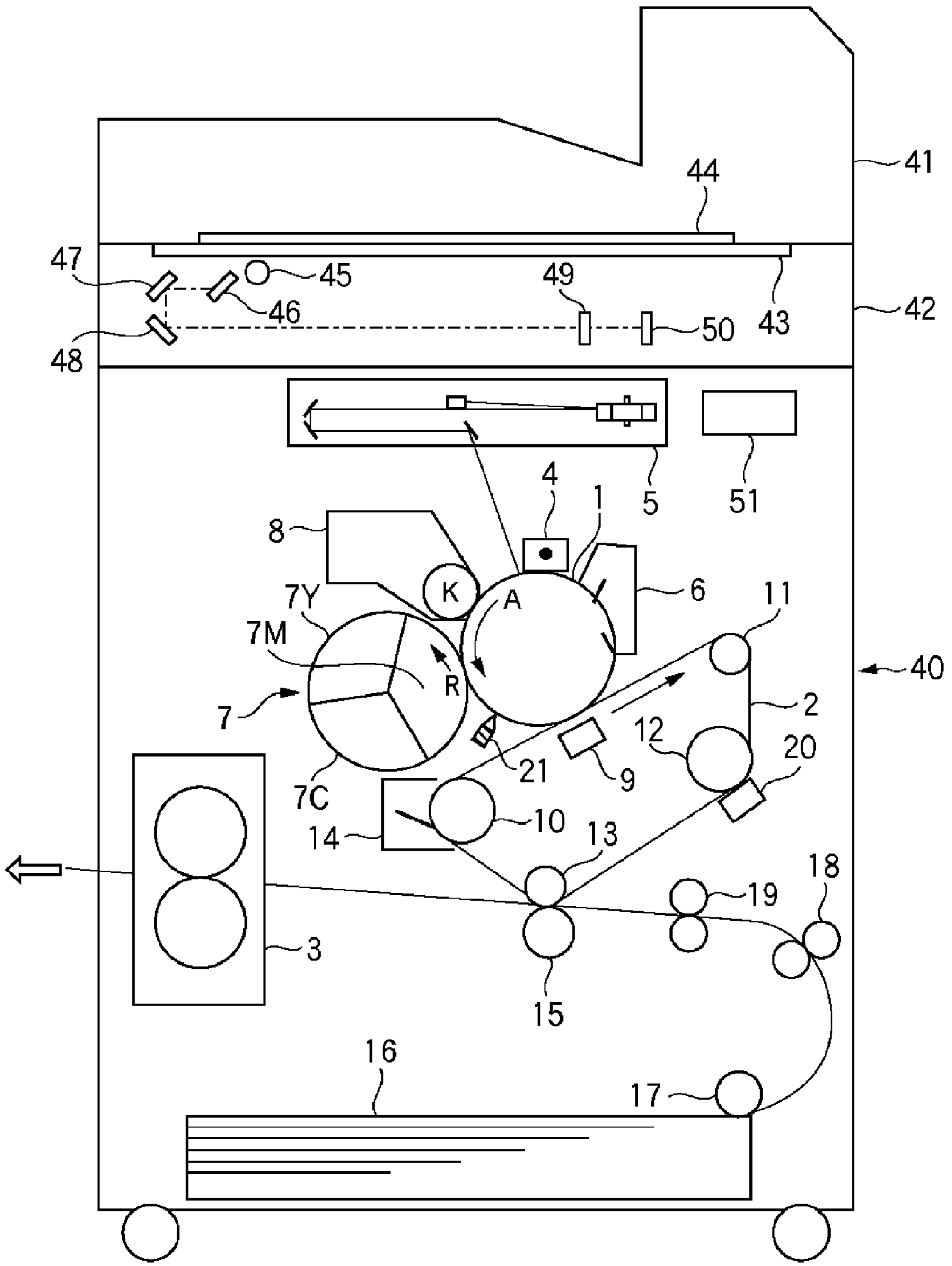
FIG. 1 is a schematic diagram illustrating the major part of an image-forming apparatus according to an embodiment of the present invention.

FIG. 1 is a schematic diagram illustrating the major part of an image-forming apparatus according to an embodiment of the present invention. In the present embodiment, the image-forming apparatus is a multifunction printer (MFP) that includes an electrophotographic printing section and that provides functions of a scanner, a facsimile machine, a copy machine, and a printer that prints data received data from, for example, a personal computer (PC). The printing section provides a color printing function using a photosensitive member and an intermediate transferring member. According to the present embodiment, a color image is formed using a single photosensitive member. However, effects similar to those of the present embodiment can also be obtained by an apparatus in which a plurality of photosensitive members corresponding to different colors are provided or an apparatus in which images are directly transferred onto a recording sheet without using the intermediate transferring member. In addition, the effects of the present embodiment are not limited to color printing, and similar effects can also be obtained by a printing section for monochrome printing.

An automatic document feeder (ADF) 41 for automatically feeding a document 44 one sheet at a time and a document reader 42 for reading images from the document 44 fed by the automatic document feeder 41 are disposed in an upper section of a main body 40 of the multifunction printer. In the document reader 42, the document 44 is placed on a platen glass 43 and is illuminated with light emitted from a light source 45, and a reflected-light image obtained from the document 44 is guided to a reading device 50, such as a charge-coupled device (CCD), via a reducing optical system including optical mirrors 46, 47, and 48 and an imaging lens 49. The image reading element 50 reads the reflected-light image obtained from the color material on the document 44 with a predetermined dot density, converts the image into electrical signals, and outputs the electrical signals.

Thus, the reflected-light image of the document 44 is read by the document reader 42 and is transmitted to an image processor 51 as data of three colors, i.e., red (R), green (G), and blue (B). The RGB data of the document 44 is subjected to image processing including shading correction, gamma correction, and color space processing by the image processor 51, and is output as image data of yellow (Y), magenta (M), cyan (C), and black (K). The multifunction printer also has a function as a printer that prints data received from an external PC (not shown) or the like. The data received from the PC or the like is transmitted to the image processor 51 and is subjected to image processing including image conversion, shading correction, gamma correction, and color space processing.

Thus, the image data is subjected to image processing by the image processor 51, and is transmitted to an exposure device 5 in the form of Y, M, C, and K (black) image data. The exposure device 5 drives a semiconductor laser such that laser light emitted from the semiconductor laser is modulated in accordance with the image data, and the laser light from the semiconductor laser is reflected by a rotating polygon mirror such that a photosensitive member 1 is scanned with the reflected light. The photosensitive member 1 is rotated in the direction shown by the arrow A with a motor (not shown). A primary charging device 4, the exposure device 5, a color development unit 7, a monochrome development unit 8, a transfer charging device 9, and a cleaner device 6 are disposed around the photosensitive member 1.

In an image-forming operation, first, the surface of the photosensitive member 1 is uniformly charged to a predetermined negative potential by the charging device 4. Then, the exposure device 5 including a laser scanner scans the charged surface of the photosensitive member 1 with the laser light emitted from the semiconductor laser that is driven by a signal that is pulse-width modulated on the basis of the image data. Accordingly, an electrostatic latent image corresponding to the image data is formed on the photosensitive member 1. The color development unit 7 includes three development devices 7Y (yellow toner), 7M (magenta toner), and 7C (cyan toner) to perform full-color development, and each development device is supplied with toner of the corresponding color. The color development devices 7Y, 7M, and 7C and the monochrome development unit 8 can develop the latent image on the photosensitive member 1 with Y, M, C, and K toners, respectively. When the latent image is developed with color toner, the color development unit 7 is rotated in the direction shown by the arrow R with a motor (not shown) until the development device for that color comes into contact with the photosensitive member 1. Each time a toner image is developed with color toner, the toner image is transferred onto a transfer belt 2, which functions as the intermediate transferring member. Accordingly, a full-color image can be formed by superimposing images of the three colors on the transfer belt 2.

The density of the toner image of each color that is developed on the photosensitive member 1 is detected by, for example, a density sensor 21 including a light-emitting element and a light-receiving element for detecting the density of the developed image. The density sensor 21 is disposed between a development position of the development device 7 and a transfer position of the transfer device 9 along the periphery of the photosensitive member 1. The density sensor 21 detects the amount reflection of light that is emitted from the light-emitting element and reflected by the surface of the photosensitive member 1 using a light-receiving element, and determines the density of a single-color toner image formed on the photosensitive member 1 on the basis of the result of detection. The density sensor 21 transmits a detection signal to the image processor 51. In the present embodiment, the density sensor 21 detects the density of the single-color toner image on the photosensitive member 1. However, the density may also be detected at other positions, such as a position on the intermediate transferring belt or a photosensitive belt, where the single-color toner image is formed.

The toner images of different colors are successively developed on the photosensitive member 1 and are transferred onto the transfer belt 2, which functions as the intermediate transferring member, by the transfer device 9. Accordingly, the toner images of four colors are superimposed on the transfer belt 2. The toner images that are thus transferred onto the transfer belt 2 are transferred onto a recording sheet by a secondary transfer device 15. In full-color printing, the toner images of four colors are superimposed on the transfer belt 2, and are then transferred onto the recording sheet. The recording sheet is fed from a paper cassette 16 into a conveying path due to rotation of a pickup roller 17, and is conveyed to a nip portion, that is, a contact portion between the secondary transfer device 15 and the belt 2, by conveying rollers 18 and 19. A belt cleaner 14 id disposed at a position where the belt cleaner 14 faces a transfer-belt driving roller 10 with the transfer belt 2 disposed therebetween. The belt cleaner 14 removes the toner that remains on the transfer belt 2 without being transferred onto the recording sheet with a blade.

The toner that remains on the surface of the photosensitive member 1 is removed and collected by a cleaner device 6 after the amount of charge of the toner is reduced by a preliminary cleaner to facilitate the cleaning process. Then, the photosensitive member 1 is uniformly discharged to about 0V by a discharging device (not shown) to prepare for the next cycle of the image-forming operation.

The recording sheet on which the toner image is transferred is conveyed to a fixing device 3, where the toner image is fixed, and is ejected from the apparatus. The fixing device 3 includes a pair of rollers having halogen heaters, which function as heating elements, contained therein. The rollers can rotate while being pressed against each other by a pressing mechanism (not shown).

In this multifunction printer, an image-forming timing is controlled on the basis of a reference position on the transfer belt 2. The transfer belt 2 is wound around rollers 10, 11, 12, and 13. Among these rollers, the transfer-belt-driving roller 10 is connected to a drive source (not shown) and functions as a drive roller for driving the transfer belt 2. In addition, transfer-belt tension rollers 11 and 12 function as tension rollers for adjusting the tension applied to the transfer belt 2. A back-up roller 13 functions as a back-up roller for the transfer roller 15, which functions as a secondary transfer device. In addition, a reflective sensor 20 that detects the passage of the reference position on the transfer belt 2 is disposed near the tension roller 12. The reflective sensor 20 detects a mark, such as a reflection tape, provided at an edge of the outer peripheral surface of the transfer belt 2 and outputs an $I_{top}$ signal.

The ratio of the circumference of the photosensitive member 1 to the circumference of the transfer belt 2 is set to a ratio of 1:n (n is an integer). Accordingly, the photosensitive member 1 rotates n turns (n is an integer) while the transfer belt 2 rotates one turn. After the transfer belt 2 rotes one turn, the positions of the surfaces of the transfer belt 2 and the photosensitive member 1 return to the initial positions. Therefore, when the toner images of four colors are superimposed on the intermediate transferring belt 2 (which means that the transfer belt 2 rotates four turns), the color misalignment due to variation in rotation of the photosensitive member 1 can be prevented.

In the above-described image-forming apparatus using the intermediate transferring method, when a predetermined time elapses after the detection of the above-described $I_{top}$ signal, the exposure device 5 (including the laser scanner) starts the exposure process. As described above, while the transfer belt 2 rotates one turn, the photosensitive member 1 rotates n turns (n is an integer) and return to exactly the same position as the position before the rotation of the transfer belt 2 and the photosensitive member 1. Therefore, the toner image is always formed at the same position on the transfer belt 2. Although the size of the toner image varies depending on the size of the recording sheet, the transfer belt 2 has a region where the toner image is never formed.

Next, the operation principle of the present embodiment will be described below with reference to FIG. 2.

Figure 2:
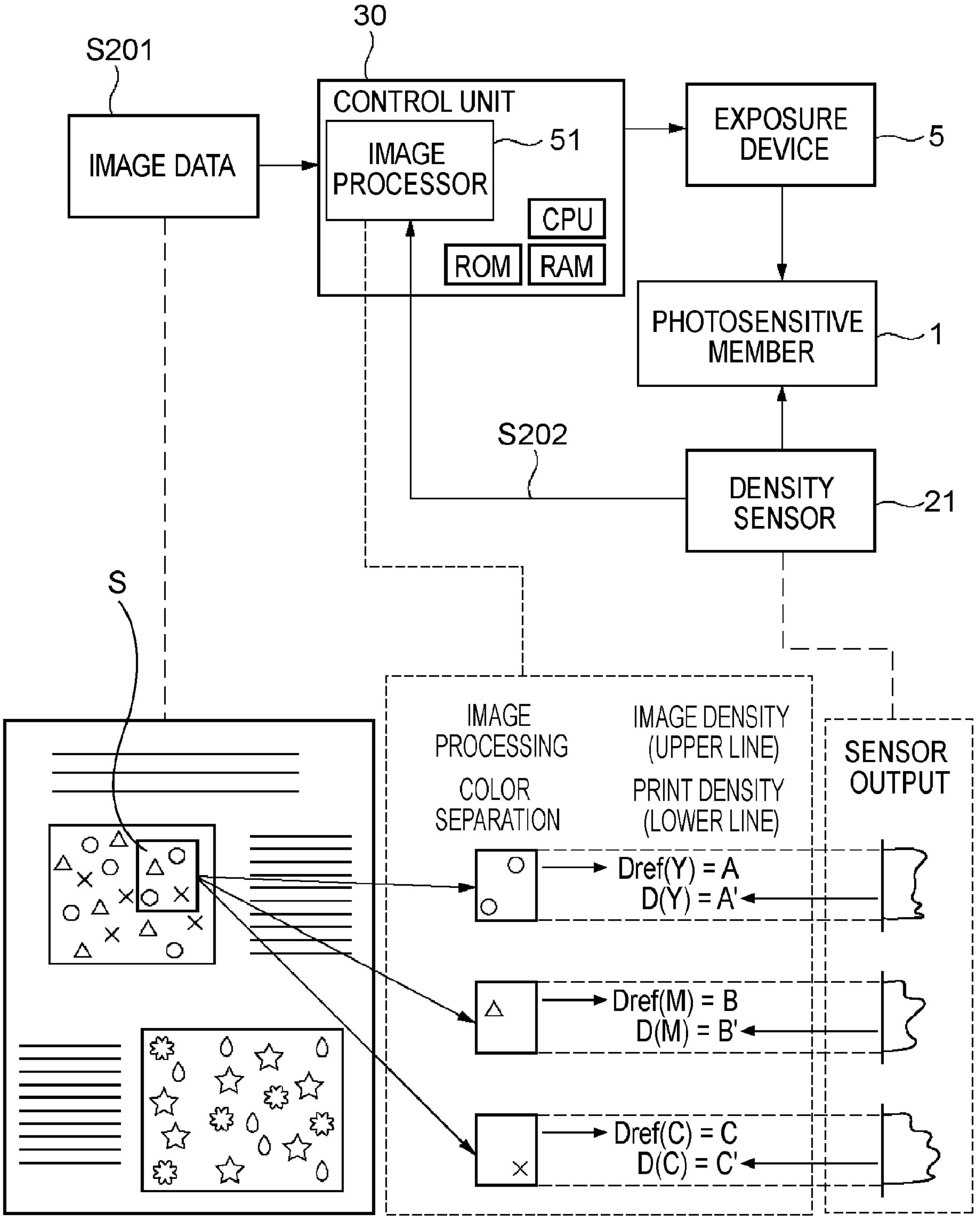
FIG. 2 is a schematic diagram illustrating the operation principle of the image-forming apparatus according to the embodiment of the present invention.

FIG. 2 is a schematic diagram illustrating the operation principle of the image-forming apparatus according to the embodiment of the present invention. In FIG. 2, components similar to those shown in FIG. 1 are denoted by the same reference numerals.

When image data S201 is input to a control unit 30 from the document reader 42 or the PC (not shown), the input image data S201 is subjected to image processing by the image processor 51. Then, the control unit 30, which will be described in detail below, determines whether or not the density of the image can be measured in a predetermined section S thereof. The control unit 30 includes a CPU, a ROM that stores programs executed by the CPU, and a RAM used as a work area when the CPU executes the programs. If it is determined that the density measurement can be performed, the control unit 30, which functions as an image-density calculator, calculates an image density $D_{ref}$ in the predetermined section S of the image to be printed for each color, that is, for each of yellow (Y), magenta (M), cyan (C), and black (K), on the basis of a video count and the characteristic of the density sensor 21. Then, the obtained result is stored in the memory (RAM). Next, in order to detect the density in the predetermined section S of the toner image formed on the photosensitive member 1 using the density detection sensor 21, which functions as a density detector, the control unit 30 calculates a delay time between the output of the $I_{top}$ signal for each color and the start of measurement and the measurement time. Accordingly, the density sensor 21 detects the density in the predetermined section S for each color and outputs a density signal S202 is transmitted to the image processor 51. The image processor 51, which functions as a density detector, converts the density signal S202 into digital data using an A/D converter 31 (FIG. 6) and calculates a print density D of the actually formed image using a density conversion table 32 that is prepared in advance. Then, the control unit 30, which also functions as a comparator, compares the image density $D_{ref}$ and the print density D and calculates a density difference ΔD.

Figure 3A:
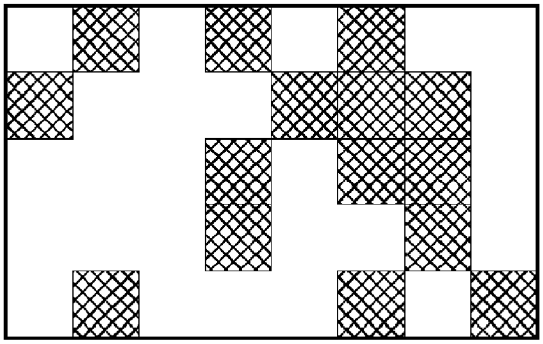
FIGS. 3A to 3C are diagrams illustrating examples of images in a predetermined section S and video counts, which function as density information, in the predetermined section S.
Figure 3B:
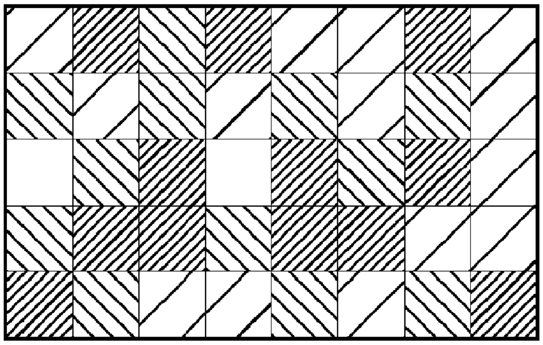
Figure 3C:
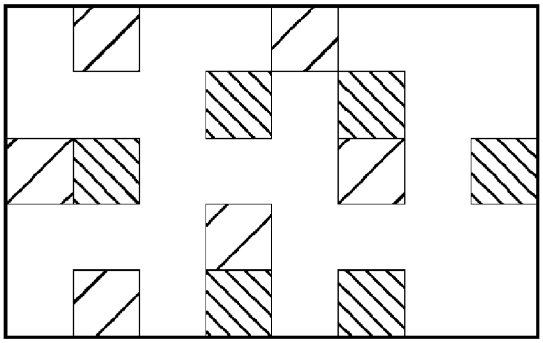

FIGS. 3A to 3C are diagrams illustrating examples of images in the predetermined section S and video counts, which function as density information, in the predetermined section S.

As shown in FIGS. 3A and 3B, when the video count is equal to or more than N (e.g., N=1000) in the predetermined section S, it is determined that the density can be detected by the density sensor 21.

However, when the video count is less than N, as shown in FIG. 3C, the S/N ratio is reduced and it is difficult to reliably measure the density. Therefore, it is determined that the density cannot be detected by the density sensor 21.

Here, the term "video count" refers to the sum of the pixel data in the predetermined section when the pixel data is expressed as multilevel data.

Figure 4A:
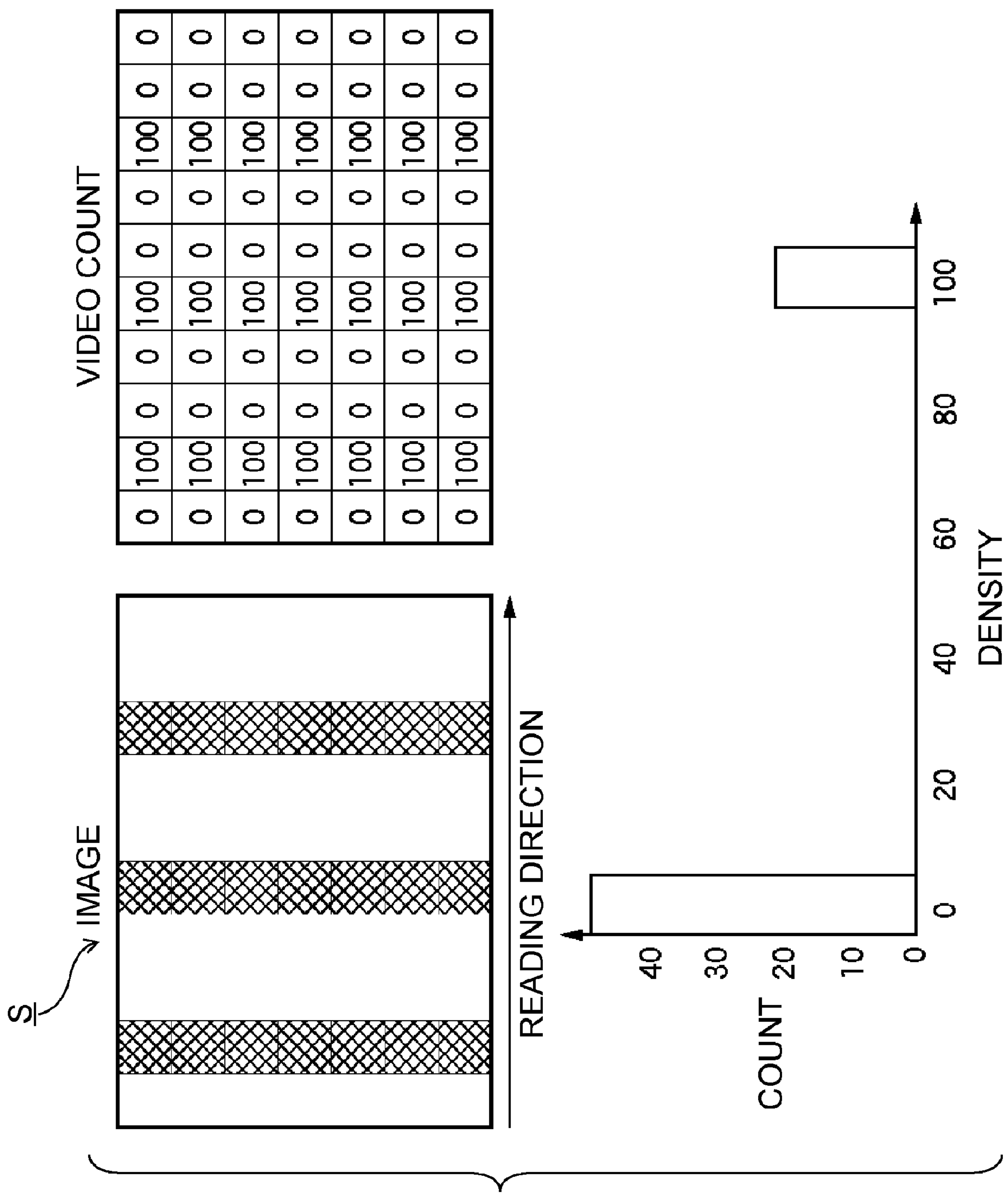
FIGS. 4A and 4B are diagrams illustrating density distributions in images having the same video count N in the predetermined section S.
Figure 4B:
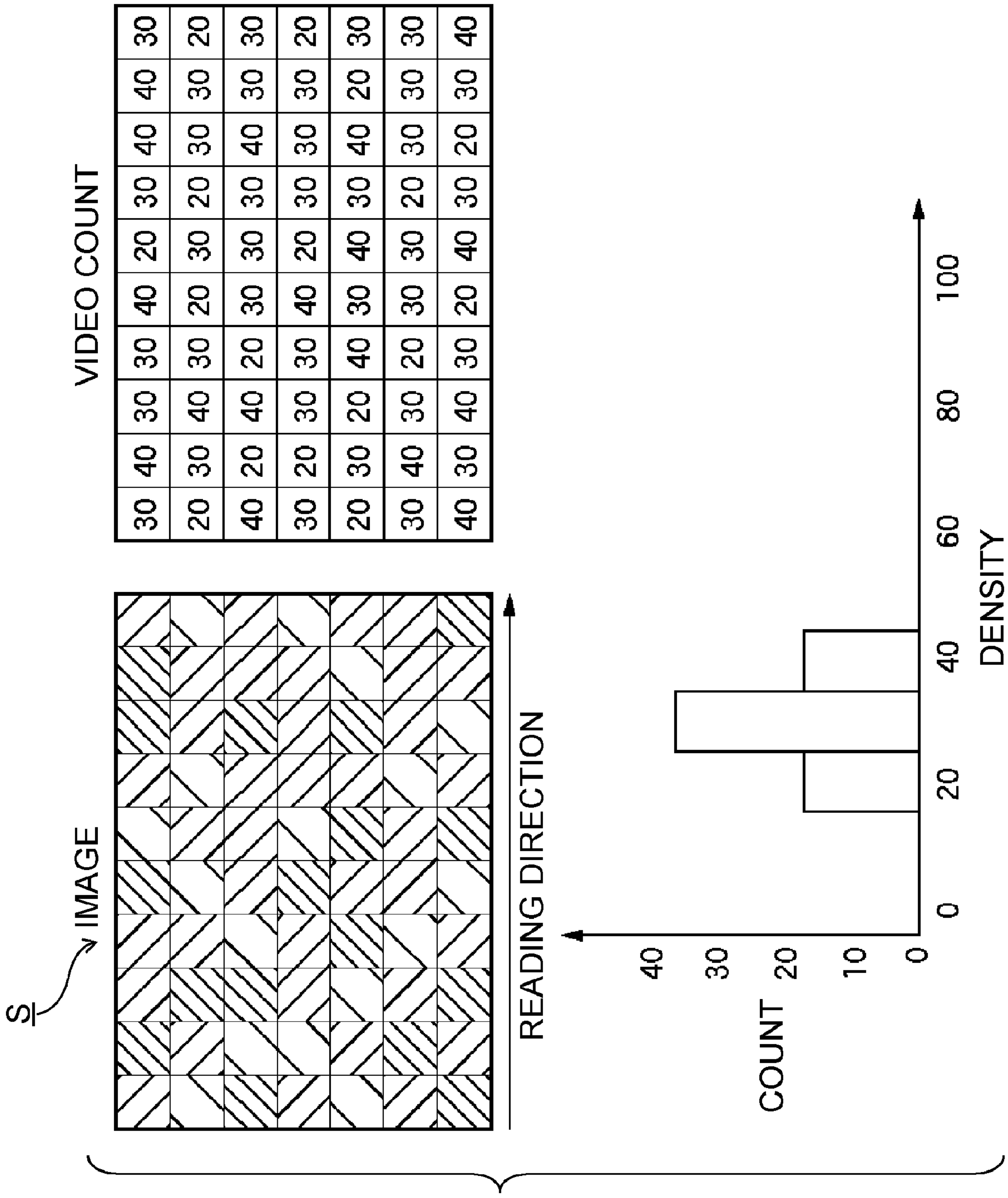

FIGS. 4A and 4B are diagrams illustrating density distributions of images having the same video count N in the predetermined section S.

When the density dispersion is low, as shown in FIG. 4B, the density can be determined with high accuracy. However, when the density dispersion is high, as shown in FIG. 4A, the response speed of the density sensor 21 and the S/N ratio are reduced, and it is difficult to detect the density with high accuracy.

Figure 5:
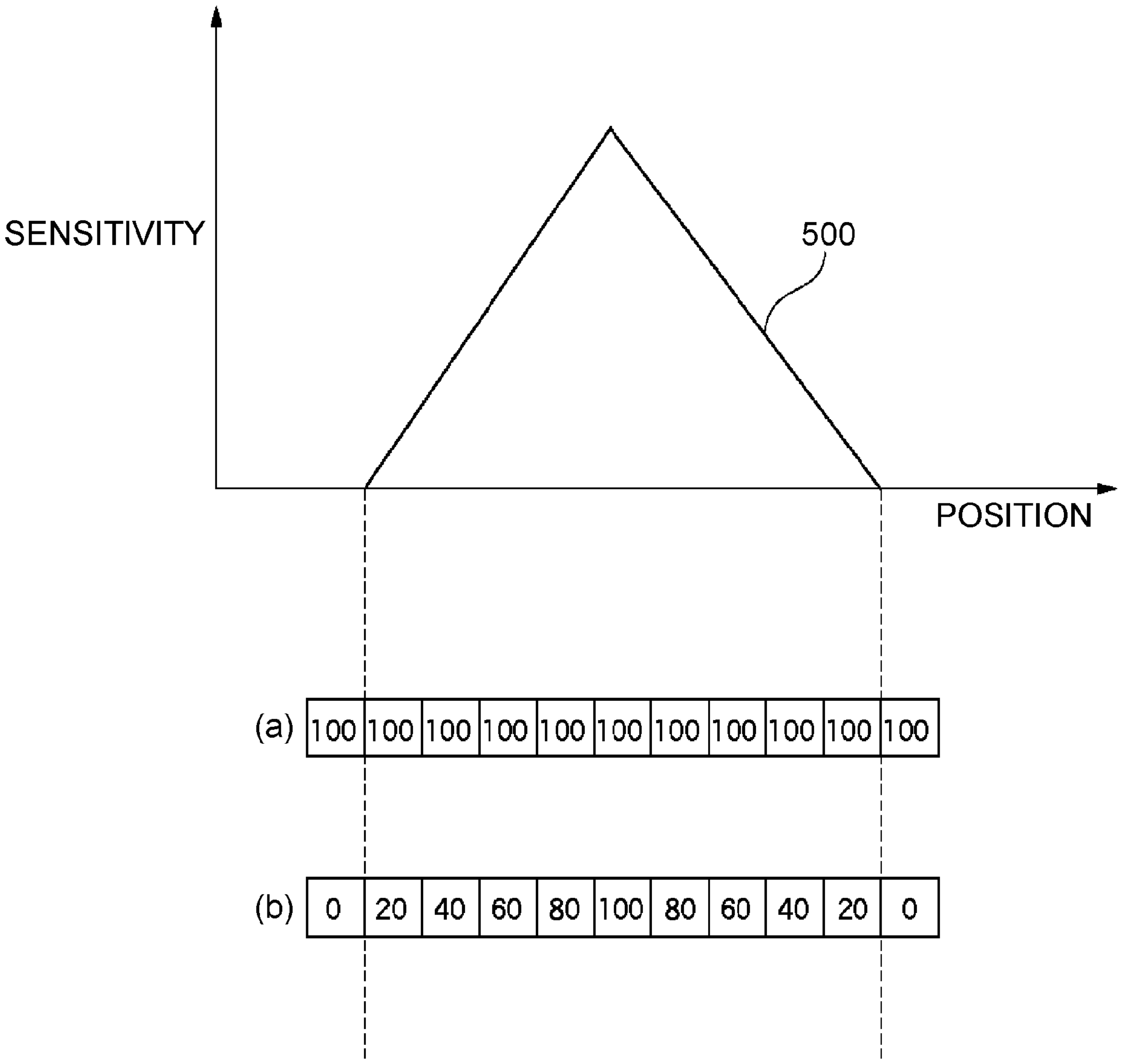
FIG. 5 is a diagram illustrating a conversion method of the video count, which functions as the density information, based on the characteristic of a density sensor.

FIG. 5 is a diagram illustrating a conversion method of the video count, which functions as the density information, based on the characteristic of the density sensor.

In order to simplify the sensitivity characteristic of the density sensor 21, it is assumed that the sensitivity is linearly reduced from the center. When the sensitivity of the density sensor 21 has a characteristic as denoted by 500 in FIG. 5, the density signal (a) at each spot can be converted into signal (b), which is used for determining the image density, in accordance with the relationship between the position and sensitivity of the density sensor 21.

The image density is determined by the steps described below. When the predetermined section S satisfies both the condition that the video count is N or more as described with reference to FIGS. 3A to 3C and the condition that the density dispersion is within a predetermined value as described with reference to FIGS. 4A and 4B, the video count of the predetermined section S is converted as described with reference to FIG. 5 on the basis of the installation position and the characteristic of the density sensor 21. Then, the control unit 30 calculates the integrated value or the average value to determine the image density $D_{ref}$ at the predetermined section S, and stores the image density $D_{ref}$ in the memory (RAM).

In this embodiment, the area of the predetermined section S corresponds to the detectable range of the density sensor 21, and can cover the overall length of the photosensitive member 1 in the longitudinal direction thereof. In such a case, a line-shaped sensor can be used as the density sensor. In addition, the sensitivity distribution is not limited to that shown in FIG. 5, and the sensor elements may have substantially the same sensitivity.

The predetermined section may also extend along the circumference of the photosensitive member 1.

Figure 6:
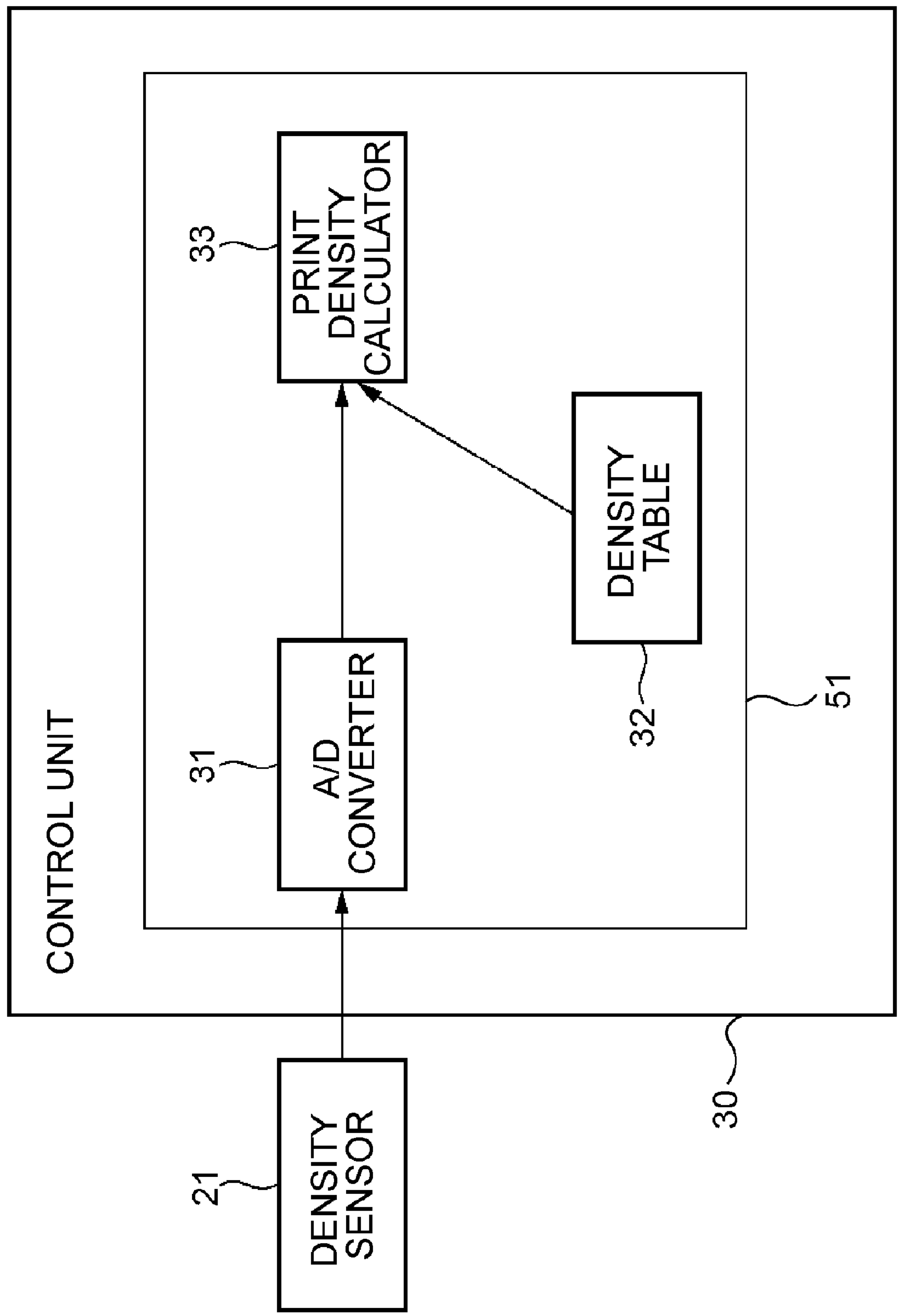
FIG. 6 is a functional block diagram illustrating the functional structure of an image processor included in a control unit according to the embodiment.

FIG. 6 is a functional block diagram illustrating the functional structure of the image processor 51 included in the control unit 30 according to the embodiment.

The density in the predetermined section S of the toner image for each color is measured by the density sensor 21 at the above-described timing. The thus measured value is output from the density sensor 21 as an analog signal, and the A/D converter 31 performs the A/D conversion of the obtained analog signal in or out of the control unit 30 at a sampling interval Δt. The value obtained by the A/D conversion is converted into the density data by referring to the density conversion table (ROM) 32 prepared in advance. Then, the print density D in the predetermined section S is calculated using the density data obtained by conversion.

Figure 7:
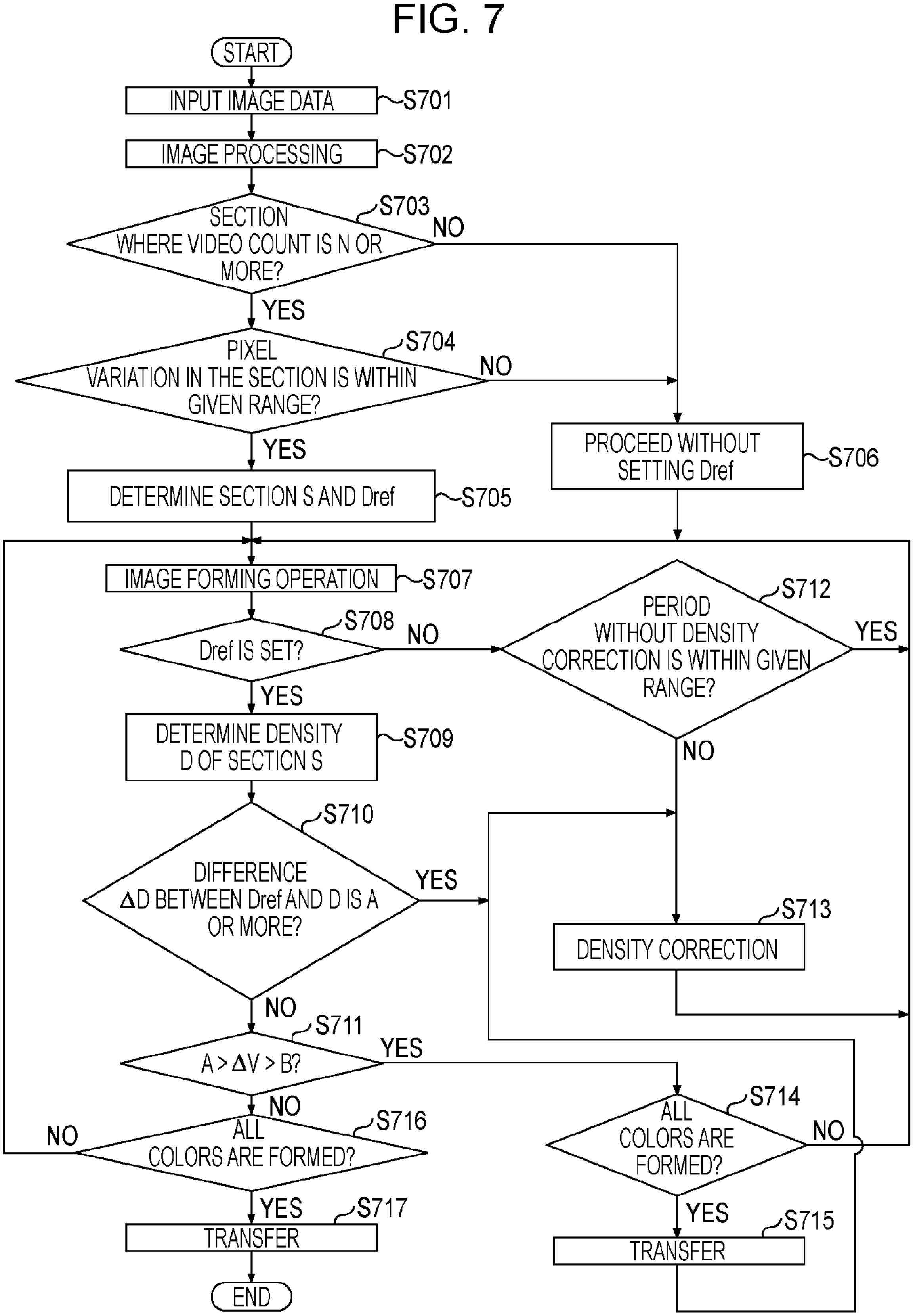
FIG. 7 is a flowchart illustrating a process for determining a density correction timing in the image-forming apparatus according to the embodiment.

FIG. 7 is a flowchart illustrating a process for determining the density correction timing in the image-forming apparatus according to the present embodiment. The program for this process is stored in the ROM included in the control unit 30, which functions as a determiner, and is executed under the control of the CPU.

First, in step S701, to start an operation of printing on a recording sheet (not shown) commanded by a user, the data of the document 44 read by the document reader 42 or the data transmitted from the PC or the like is input and transmitted to the image processor 51. Then, in step S702, the image data transmitted to the image processor 51 is subjected to image processing such as shading correction, gamma correction, color space processing, etc. Then, after the image processing is performed by the image processor 51, the image data is divided into image signals for, for example, Y (yellow), M (magenta), C (cyan), K (black), etc., used for printing. Next, in step S703, it is determined whether or not the video count, which is the density information, in the predetermined section S set arbitrarily in a range that can be read by the density sensor 21 is equal to or more than a predetermined number (N) on the basis of the image data subjected to image processing or the image signals. Thus, it is determined whether or not the density can be reliably detected by the density sensor 21. When the video count in the predetermined section S is less than the predetermined number (N), the process proceeds to step S706 and the image density $D_{ref}$ is not set since it is determined that the print density in the predetermined section S cannot be monitored by the density sensor 21.

If it is determined that the video count in the predetermined section S is equal to or more than the predetermined number (N), the process proceeds to step S704, where the density dispersion of the image information in the predetermined section S is calculated. Then, it is determined whether or not the determined density dispersion is within a given range. If the density dispersion is within the given range, it is determined that the density of the image in the predetermined section S can be reliably detected and the process proceeds to step S705, where the image density $D_{ref}$ in the predetermined section S is determined on the basis of the characteristic of the density sensor 21 and the video count. If it is determined that the density dispersion in the predetermined section S is out of the given range in step S704, the print density in the predetermined section S cannot be monitored by the density sensor 21. Therefore, the process proceeds to step S706 and the image density $D_{ref}$ is not set.

After steps S705 and S706, the process proceeds to step S707, where the semiconductor laser is driven on the basis of the image information input in step S701 and a toner image is formed on the photosensitive member 1 by the above-described method. Then, in step S708, whether or not the image density $D_{ref}$ is set for the formed toner image is checked. If the image density $D_{ref}$ is set, it is determined that the density detection can be performed and the process proceeds to step S709, where the density in the predetermined section S is detected at the above-described timing. Then, the thus obtained density signal is subjected to A/D conversion and the print density D for each color is calculated using the density conversion table 32. Then, in step S710, the control unit 30 compares the image density $D_{ref}$ in the predetermined section S calculated in step S705 and the print density D calculated in step S709 and calculates the difference ΔD therebetween. Then, if the difference ΔD is out of a given range A, the process proceeds to step S713, where the density correction is performed immediately.

When the difference ΔD is within the given range between A and B (A>ΔD>B), the process proceeds to step S714. After images of all of the colors required by the image data are formed and the toner images of all colors are transferred onto the transfer belt 2 in step S715, the process proceeds to step S713. In step S713, the control unit 30, which functions as a density adjuster, forms a correction pattern and performs density correction for image data on the basis of signals obtained by optically reading the correction pattern with the density sensor 21. If the difference ΔD is within the given range B in step S711, it is determined that the density correction is not necessary and the process proceeds to step S716, where it is determined whether or not the images of all of the colors required by the image data are formed. If it is determined that the formation of images of all colors is not yet finished, the process returns to step S707. After the toner images of all colors are formed, the toner images are transferred onto the transfer belt 2 and then onto the recording sheet in step S717.

If the difference ΔD is more than the given range B (for example, 5%) and less than A (20%), the quality of a resulting image on the recording sheet would not be particularly low. Therefore, it is determined that the image can be used as a normal image and is formed on the recording medium so as not to waste the toner images formed on the photosensitive member 1 and the transfer belt 2.

However, when the calculated difference is more than the given range A in step S710, it is decided that the density correction must be performed immediately and the process proceeds to step S713 without transferring the toner images onto the recording sheet.

If it is determined that the image density $D_{ref}$ is not set in step S708, it is determined that the density detection cannot be performed and the process proceeds to step S712. In step S712, it is determined whether or not factors including the number of recording sheets on which images are printed without density correction satisfy predetermined conditions for ensuring the print density. If it is determined that the conditions are satisfied, the process returns to step S707 and the image-forming operation is continued.

When it is determined that density correction is necessary in step S710 or S712, the image-forming operation is temporarily stopped and the process proceeds to step S713, where a density correction sequence similar to that disclosed in Japanese Patent Laid-Open No. 6-11965 is performed as soon as the state in which the correction can be performed is obtained. Then, when the density correction sequence is finished, the process returns to step S707 and the image-forming operation is restarted.

The given ranges A and B used in steps S710 and S711 can be determined as described below. When the spot diameter of the sensor is about 1 mm, the size of the predetermined section S can be set to about 3 mm×3 mm. In this case, the number of sensor spots included in the section S is about 5,000. When each pixel data is expressed with 8 bits and the pixel average of the density difference ΔD in the predetermined section S (5,000 pixels) is about 5%, the difference in each pixel is about 10. Therefore, the density correction is necessary when the difference is 5,000 pixels×(10/pixel)=50,000 in the predetermined section S. If, for example, the density difference ΔD largely exceeds 5% and is 20% of more (e.g., 30%) in step S710, the density of the printed image cannot be ensured. Accordingly, the image is not transferred onto the recording sheet and the density correction is performed even though the toner is wasted. In step S711, it is determined whether or not the density of the resulting image can be somewhat ensured. If the difference is within the predetermined range, the image transfer process is performed to the end and the image is printed, so that the toner can be prevented from being wasted. Then, after the image is transferred onto the recording sheet, the density correction is performed.

Although a single-color toner image is monitored by the density sensor 21 in the present embodiment, a density sensor may be disposed so as to face the roller 11 of the transfer belt 2 and toner images of a plurality of colors superimposed on the transfer belt 2 can be measured using the density sensor. In such a case, a similar control operation can be performed by subjecting the obtained signal to color separation.

As described above, according to the present embodiment, when the user performs the image-forming operation, the density of images formed by the image-forming apparatus is monitored in real time and the timing for adjusting the density is determined accordingly. Therefore, the density correction can be performed at an adequate timing. As a result, the density correction can be prevented from being performed unnecessarily. In addition, the down time of the image-forming apparatus can be reduced, so that the productivity can be increased.

In addition, since the pattern for density correction is not formed when the density correction is not necessary, the toner can be prevented from being wasted.

The process for determining the density correction timing is performed every time a predetermined number of recording sheets are subjected to printing. In the present embodiment, the predetermined number of recording sheets is set to one, and it is determined whether or not to perform the density adjustment each time the image-forming operation is performed. However, if it can be assumed that sudden variation does not occur, the predetermined number of recording sheets may also be set to, for example, five, and the process for determining the density correction timing may be performed every time five recording sheets are subjected to printing. In addition, the predetermined number of recording sheets can be set to more than five as long as the expected variation is allowable. In such a case, the processing load on the control unit 30 can be reduced.

According to the present invention, a software program for carrying out the functions of the above-described embodiment can be directly or remotely supplied to a system or an apparatus. Thus, the present invention includes a case in which the thus supplied program code is read out and executed by a computer included in the system or the apparatus. The form of the program code is not limited to the program as long as the functions of the program can be provided. Thus, the present invention can also be achieved by the program code itself that is installed in the computer for allowing the computer to carry out the functions of the present invention. In other words, the present invention includes the computer program for achieving the functions of the present invention. In this case, the form of the program is not limited as long as the functions of the program can be obtained, and may be, for example, an object code, a program executed by an interpreter, script data supplied to an OS, etc.

A storage medium for supplying the program may be, for example, a floppy disk (registered trademark), a hard disk, an optical disc, a magneto-optical disk, an MO, a CD-ROM, a CD-R, a CD-RW, a magnetic tape, a nonvolatile memory card, a ROM, a DVD (DVD-ROM and DVD-R), etc. In addition, the program can also be obtained by accessing a Web page on the Internet using a browser on a client computer. The computer program according to the present invention or a file including the program in a compressed form and having an automatic installation function can be downloaded from the Web page to a storage medium, such as a hard disk. Alternatively, the program code that functions as the program according to the present invention may be divided into a plurality of files, and these files may be downloaded from different Web pages. Thus, a WWW server from which a program file for allowing the computer to carry out the functions of the present invention is downloaded by a plurality of users is also included in the present invention.

The program according to the present invention may be stored in storage media, such as CD-ROMs, in an encrypted form, and be distributed to users. The users can download key information for decoding the encrypted program from a Web page via the Internet. Thus, the encrypted program can be executed using the key information and installed into the computer.

The computer can carry out the functions of the above-described embodiment by reading out and executing the program. In addition, the functions of the above-described embodiment can also be carried out by causing the OS or the like running on the computer to perform all or part of the actual processes on the basis of the instructions of the program.

The program read out from the recording medium may be written in a memory provided in a function expansion board included in the computer or in a function expansion unit connected to the computer. In such a case, the functions of the above-described embodiments can also be carried out by causing the CPU or the like included in the function expansion board or the function expansion unit to perform all or part of the actual processes on the basis of the instructions of the program.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the priority of Japanese Application No. 2005-252467 filed Aug. 31, 2005 and Japanese Application No. 2006-200873 filed Jul. 24, 2006, both of which are hereby incorporated by reference herein in their entirety.

What is claimed is:

1. An image-forming apparatus that forms an image by transferring a toner image formed on an image carrier onto a recording medium, the image-forming apparatus comprising:

a density detector that detects a density of a toner image on the image carrier;

a density adjuster that forms a correction pattern and performs an image-density adjustment on the basis of the correction pattern and the density of the toner image that is detected the density detector;

an image-density calculator that calculates an image density in a predetermined section of an image represented by an image signal which is different from the correction pattern, the image density being calculated on the basis of the image signal;

a comparator that compares the image density calculated by the image-density calculator and the result of detection performed by the density detector to obtain a density in the predetermined section of a toner image formed on the basis of the image signal; and a determiner that determines whether or not to cause the density adjuster to perform the image-density adjustment on the basis of the result of comparison performed by the comparator, wherein the predetermined section is a section in which the density based on the image signal is equal to or more than a predetermined value and a density dispersion based on the image signal is equal to or less than a predetermined value.

2. The image-forming apparatus according to claim 1, wherein the determiner determines whether or not to cause the density adjuster to perform the image-density adjustment every time a predetermined number of sheets are subjected to an image-forming operation.

3. The image-forming apparatus according to claim 1, wherein the determiner causes the density adjuster to perform the image-density adjustment without transferring the toner image onto a recording medium if a difference between the image density calculated by the image-density calculator and the density detected by the density detector is equal to or more than a first threshold according to the result of comparison performed by the comparator, and causes the density adjuster to perform the image-density adjustment after transferring the toner image onto the recording medium if the difference is less than the first threshold and equal to or more than a second threshold according to the result of comparison performed by the comparator.

4. The image-forming apparatus according to claim 1, wherein the comparator determines an actual image density by referring to a density conversion table for converting the density detected by the density detector into an image density of an actually formed image and compares the actual image density and the image density calculated by the image-density calculator.

5. An image-forming apparatus that forms an image by transferring a toner image formed on an image carrier onto a recording medium, the image-forming apparatus comprising:

a density detector that detects a density of a toner image on the image carrier;

a density adjuster that forms a correction pattern and performs an image-density adjustment on the basis of the correction pattern and the density of the toner image that is detected the density detector;

an image-density calculator that calculates an image density in a predetermined section of an image represented by an image signal which is different from the correction pattern, the image density being calculated on the basis of the image signal;

a comparator that compares the image density calculated by the image-density calculator and the result of detection performed by the density detector to obtain a density in the predetermined section of a toner image formed on the basis of the image signal; and a determiner that determines whether or not to cause the density adjuster to perform the image-density adjustment on the basis of the result of comparison performed by the comparator, wherein the determiner causes the density adjuster to perform the image-density adjustment without transferring the toner image onto a recording medium if a difference between the image density calculated by the image-density calculator and the density detected by the density detector is equal to or more than a first threshold according to the result of comparison performed by the comparator, and causes the density adjuster to perform the image-density adjustment after transferring the toner image onto the recording medium if the difference is less than the first threshold and equal to or more than a second threshold according to the result of comparison performed by the comparator.

6. An image-forming apparatus that forms an image by transferring a toner image formed on an image carrier onto a recording medium, the image-forming apparatus comprising:

a control unit that determines whether or not to perform an image-density adjustment based on correction pattern data every time a predetermined number of sheets are subjected to an image-forming operation, the control unit including, a density detector that detects a density of a toner image on the image carrier;

an image-density calculator that calculates an image density in a predetermined section of an image represented by an image signal that is different from the correction pattern, the image density being calculated on the basis of the image signal;

a comparator that compares the image density calculated by the image-density calculator and the result of detection performed by the density detector to obtain a density in the predetermined section of a toner image formed on the basis of the image signal; and a determiner that determines whether or not to perform the image-density adjustment based on the correction pattern on the basis of the result of comparison performed by the comparator wherein the predetermined section is a section in which the density based on the image signal is equal to or more than a predetermined value and a density dispersion based on the image signal is equal to or less than a predetermined value.

7. A method for controlling an image-forming apparatus that forms an image by transferring a toner image formed on an image carrier onto a recording medium, the method comprising:

a density-detecting step of detecting the density of a toner image on the image carrier;

a density-adjusting step of performing an image-density adjustment on the basis of the correction pattern and the density of the toner image that is detected in the density-detecting step;

an image-density-calculating step of calculating an image density in a predetermined section of an image represented by an image signal which is different from the correction pattern, the image density being calculated on the basis of the image signal;

a comparing step of comparing the image density calculated in the image-density-calculating step and the result of detection performed in the density-detecting step to obtain a density in the predetermined section of a toner image formed on the basis of the image signal; and a determining step of determining whether or not to perform the density-adjusting step of adjusting the image density on the basis of the result of comparison performed in the comparing step, wherein it is determined in the determining step that the image-density adjustment is to be performed in the density-adjusting step without transferring the toner image onto a recording medium if a difference between the image density calculated in the image-density-calculating step and the density detected in the density-detecting step is equal to or more than a first threshold according to the result of comparison performing in the comparing step, and that the image-density adjustment is to be performed in the density-adjusting step after transferring the toner image onto the recording medium if the difference is less than the first threshold and equal to or more than a second threshold according to the result of comparison performed in the comparing step.

8. A method for controlling an image-forming apparatus that forms an image by transferring a toner image formed on an image carrier onto a recording medium, the method comprising:

a density-detecting step of detecting the density of a toner image on the image carrier;

a density-adjusting step of performing an image-density adjustment on the basis of the correction pattern and the density of the toner image that is detected in the density-detecting step;

an image-density-calculating step of calculating an image density in a predetermined section of an image represented by an image signal which is different from the correction pattern, the image density being calculated on the basis of the image signal;

a comparing step of comparing the image density calculated in the image-density-calculating step and the result of detection performed in the density-detecting step to obtain a density in the predetermined section of a toner image formed on the basis of the image signal; and a determining step of determining whether or not to perform the density-adjusting step of adjusting the image density on the basis of the result of comparison performed in the comparing step wherein the predetermined section is a section in which the density based on the image signal is equal to or more than a predetermined value and a density dispersion based on the image signal is equal to or less than a predetermined value.

9. The method according to claim 8, wherein, in the comparing step, an actual image density is determined by referring to a density conversion table for converting the density detected in the density-detecting step into an image density of an actually formed image and is compared with the image density calculated in the image-density-calculating step.

10. The method according to claim 8, wherein it is determined in the determining step that the image-density adjustment is to be performed in the density-adjusting step without transferring the toner image onto a recording medium if a difference between the image density calculated in the image-density-calculating step and the density detected in the density-detecting step is equal to or more than a first threshold according to the result of comparison performed in the comparing step, and that the image-density adjustment is to be performed in the density-adjusting step after transferring the toner image onto the recording medium if the difference is less than the first threshold and equal to or more than a second threshold according to the result of comparison performed in the comparing step.

* * * * *